United States Patent
Beach

(10) Patent No.: US 7,649,215 B2
(45) Date of Patent: Jan. 19, 2010

(54) III-NITRIDE DEVICE PASSIVATION AND METHOD

(75) Inventor: Robert Beach, Altadena, CA (US)

(73) Assignee: International Rectifier Corporation, El Segundo, CA (US)

( * ) Notice: Subject to any disclaimer, the term of this patent is extended or adjusted under 35 U.S.C. 154(b) by 424 days.

(21) Appl. No.: 11/004,212

(22) Filed: Dec. 3, 2004

(65) Prior Publication Data

US 2006/0006413 A1   Jan. 12, 2006

Related U.S. Application Data

(60) Provisional application No. 60/527,627, filed on Dec. 5, 2003, provisional application No. 60/527,634, filed on Dec. 5, 2003.

(51) Int. Cl.
*H01L 29/778* (2006.01)

(52) U.S. Cl. .............................. 257/194; 257/E29.249; 257/E29.252

(58) Field of Classification Search ................... 257/20, 257/192, 194, 201, 541, 472, E29.246–E29.254
See application file for complete search history.

(56) References Cited

U.S. PATENT DOCUMENTS

| | | | | |
|---|---|---|---|---|
| 6,586,781 B2 * | 7/2003 | Wu et al. | | 257/194 |
| 6,674,101 B2 * | 1/2004 | Yoshida | | 257/194 |
| 6,841,410 B2 * | 1/2005 | Sasaoka | | 438/47 |
| 6,914,273 B2 * | 7/2005 | Ren et al. | | 257/194 |
| 2002/0167023 A1 | 11/2002 | Chavarkar et al. | | |
| 2002/0171405 A1 * | 11/2002 | Watanabe | | 323/282 |
| 2003/0082860 A1 * | 5/2003 | Yoshida et al. | | 438/184 |
| 2004/0129200 A1 * | 7/2004 | Kouvetakis et al. | | 117/2 |
| 2005/0077541 A1 * | 4/2005 | Shen et al. | | 257/194 |

FOREIGN PATENT DOCUMENTS

JP           60196976 A  * 10/1985

OTHER PUBLICATIONS

English abstract for JP 60-196976 (Oct. 1985).*
International Search Report dated Jun. 10, 2005 for PCT Application No. PCT/US04/40605.

* cited by examiner

*Primary Examiner*—Allan R. Wilson
(74) *Attorney, Agent, or Firm*—Farjami & Farjami LLP

(57) ABSTRACT

An embodiment of a III-nitride semiconductor device and method for making the same may include a low resistive passivation layer that permits the formation of device contacts without damage to the III-nitride material during high temperature processing. The passivation layer may be used to passivate the entire device. The passivation layer may also be provided in between contacts and active layers of the device to provide a low resistive path for current conduction. The passivation process may be used with any type of device, including FETs, rectifiers, schottky diodes and so forth, to improve breakdown voltage and prevent field crowding effects near contact junctions. The passivation layer may be activated with a low temperature anneal that does not impact the III-nitride device regarding outdiffusion.

14 Claims, 3 Drawing Sheets

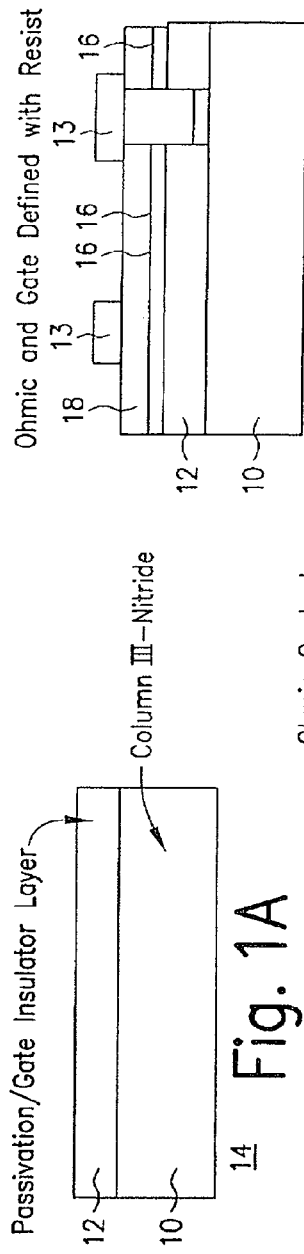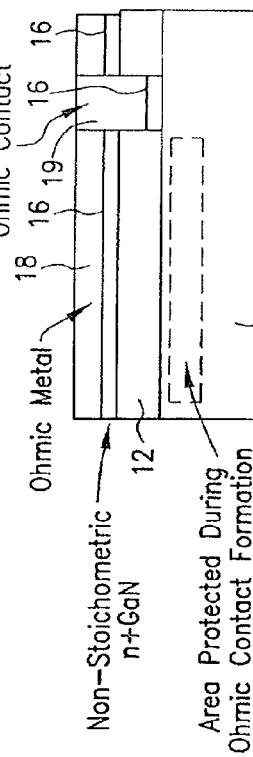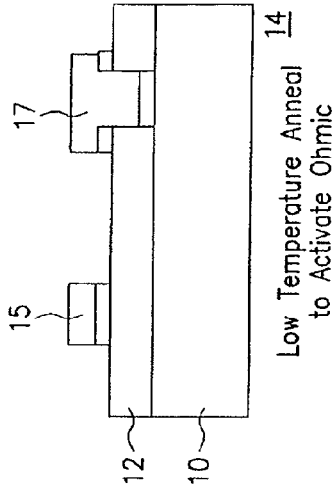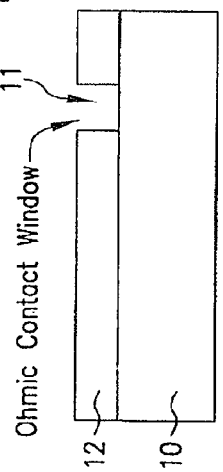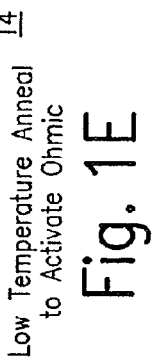

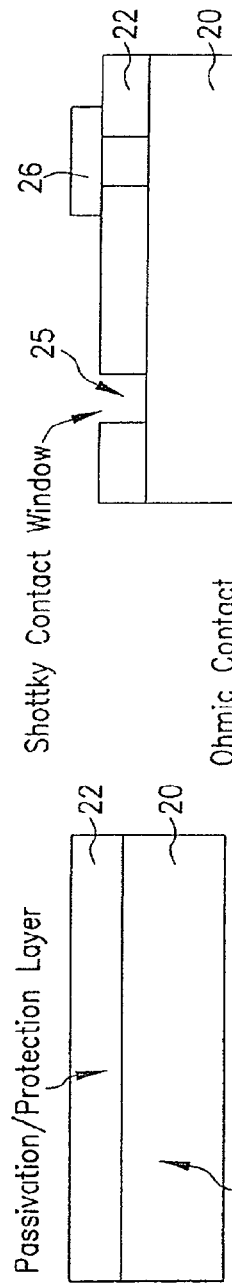
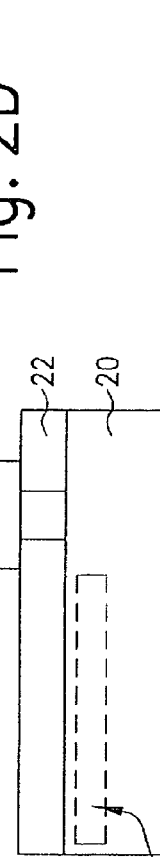
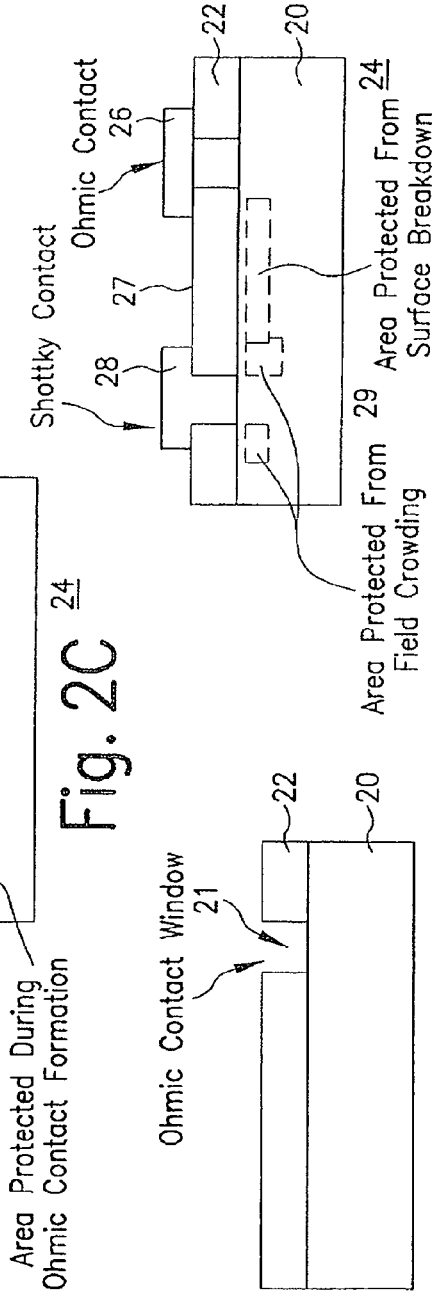

III-NITRIDE DEVICE PASSIVATION AND METHOD

RELATED APPLICATIONS

This application is based on and claims benefit of U.S. Provisional Application Ser. No. 60/527,627, filed Dec. 5, 2003, entitled Hi Voltage Horizontal Geometry Column III-Nitride Devices with High Temperature Encapsulants and U.S. Provisional Application Ser. No. 60/527,634, filed Dec. 5, 2003, entitled Ohmic Contact For GaN Devices, to both of which claims of priority are hereby made and the disclosures of which are hereby incorporated by reference.

BACKGROUND OF THE INVENTION

1. Field of the Invention

The present invention relates generally to formation of a III-nitride material system device, and relates more particularly to a III-nitride material system device formed with an ohmic contact and a method for forming the contact with a residual passivation layer.

2. Description of Related Art

III-nitride semiconductors are presently known that exhibit a large dielectric breakdown field of greater than 2.2 MV/cm. III-nitride heterojunction structures are also capable of carrying extremely high currents, which makes devices fabricated in the III-nitride material system excellent for power applications.

Development of devices based on III-nitride materials has generally been aimed at high power-high frequency applications such as emitters for cell phone base stations. The devices fabricated for these types of applications are based on general device structures that exhibit high electron mobility and are referred to variously as heterojunction field effect transistors (HFETs), high electron mobility transistors (HEMTs) or modulation doped field effect transistors (MODFETs). These types of devices are typically able to withstand high voltages such as in the range of 100 Volts, while operating at high frequencies, typically in the range of 2-100 GHz. These types of devices may be modified for a number of types of applications, but typically operate through the use of piezoelectric polarization fields to generate a two dimensional electron gas (2DEG) that allows transport of very high current densities with very low resistive losses. The 2DEG is formed at an interface of AlGaN and GaN materials in these conventional III-nitride HEMT devices. Due to the nature of the AlGaN/GaN interface, and the formation of the 2DEG at the interface, devices that are formed in the III-nitride materials system tend to be nominally on, or depletion mode devices. The high electron mobility of the 2DEG at the interface of the AlGaN/GaN layers permits the III-nitride device, such as a HEMT device, to conduct without the application of a gate potential. The nominally on nature of the HEMT devices previously fabricated have limited their applicability to power management. The limitations of nominally on power devices is observed in the need to have a control circuit be powered and operational, before power can be safely controlled by a nominally on device. Accordingly, it would be desirable to create a III-nitride heterojunction device that is nominally off to avoid current conduction problems during start-up and other modes.

A drawback of III-nitride devices that permit high current densities with low resistive losses is the limited thickness that can be achieved in the strained AlGaN/GaN system. The difference in the lattice structures of these types of materials produces a strain that can result in dislocation of films grown to produce the different layers. This results in high levels of leakage through a barrier layer, for example. Some previous designs have focused on reducing the in-plane lattice constant of the AlGaN layer to near where the point of relaxation occurs to reduce the dislocation generation and leakage. However, the problem of limited thickness is not addressed by these designs.

Another solution is to add insulation layers to prevent leakage problems. The addition of an insulator layer can reduce the leakage through the barrier, and typical layers used for this purpose are silicon oxide, silicon nitride, saphire, or other insulators, disposed between the AlGaN and metal gate layers. This type of device is often referred to as a MISHFET and has some advantages over the traditional devices that do not have an insulator layer.

While additional insulator layers can permit thicker strained AlGaN/GaN systems to be constructed, the confinement layer produced by the additional insulator results in lower current carrying capacity due to the scattering effect produced on electrons at the GaN/insulator interface. Also, the additional interface between the AlGaN layer and the insulator results in the production of interface trap states that slow the response of the device. The additional thickness of the oxide, plus the additional interfaces between the two layers, also results in the use of larger gate drive voltages to switch the device.

Conventional device designs using nitride material to obtain nominally off devices rely on this additional insulator to act as a confinement layer, and may reduce or eliminate the top AlGaN layer. These devices, however, typically have lower current carrying capacity due to scattering at the GaN/insulator interface.

Accordingly, it would be desirable to produce a heterojunction device or FET that has a low leakage characteristic with fewer interfaces and layers that can still withstand high voltage and produce high current densities with low resistive losses. Presently, planar devices have been fabricated with GaN and AlGaN alloys through a number of techniques, including MOCVD (metal organic chemical vapor deposition) as well as molecular beam epitaxy (MBE) and hydride vapor phase epitaxy (HVPE).

Materials in the gallium nitride material system may include gallium nitride (GaN) and its alloys such as aluminum gallium nitride (AlGaN), indium gallium nitride (InGaN) and indium aluminum gallium nitride (InAlGaN). These materials are semiconductor compounds that have a relatively wide direct bandgap that permits highly energetic electronic transitions to occur. Gallium nitride materials have been formed on a number of different substrates including silicon carbide (SiC), saphire and silicon. Silicon substrates are readily available and relatively inexpensive, and silicon processing technology has been well developed.

However, forming gallium nitride materials on silicon substrates to produce semiconductor devices presents challenges that arise from differences in the lattice constant, thermal expansion and bandgap between silicon and gallium nitride. The problems attendant with the lattice mismatch between GaN and traditional substrate materials are also prevalent in material layer structures involving GaN and GaN alloys. For example, GaN and AlGaN materials have lattice structures that differ significantly enough to produce interface strain between the layers, contributing to piezoelectric polarization. In many previous devices, the fields generated by the piezoelectric polarization are controlled to improve the characteristics of the devices. Variations in the content of aluminum in the AlGaN/GaN layer structures tends to vary the lattice mismatch between the materials to achieve different device characteristics, such as improved conductivity or isolation barriers.

A number of types of power devices can potentially benefit from a nominally off device with low on resistance. For example, it would desirable to obtain a power switch, power rectifier, synchronous rectifier, current control device or other power devices that are nominally off when no power is applied. Current control devices can include diodes, pinch resistors, Schottky diodes and the like.

Another feature of a power device that is desirable to improve or optimize is the breakdown voltage. Typically, high voltage switching devices produced from semiconductors are exposed to very high electric fields that can be the source of dielectric breakdown in the power devices. III-nitride material devices can be particularly vulnerable to dielectric breakdown failures due to the nature of formation of the devices in the III-nitride material system. During processing of III-nitride material devices, high temperature annealing steps or chemical treatments are frequently used to produce low resistance ohmic contacts that are connected to low or moderately doped semiconductor material. During the high temperature annealing steps, the surface of the semiconductor material being annealed loses nitrogen due to the volatile nature of near-surface nitrogen in a high temperature annealing environment. The loss of nitrogen from the semiconductor material results in vacancies in the material that produces an N-type dopant effect in this material system. The effect of the additional doping beyond the normal or expected doping of the semiconductor material surface layer produces increased electric fields near the surface region of the device during voltage blocking operations. For example, if the device is a field effect transistor in an off state, the device is expected to standoff potentially large voltages without breaking down. However, due to the greater than expected doping effect of the surface layer of the semiconductor material, and the attendant increased electrical fields in the surface region, lower breakdown voltages are observed, in conjunction with device failures.

One way to avoid the effective doping that occurs with the removal of nitrogen from the surface of the semiconductor material is to form a highly doped III-nitride material on a top surface of the semiconductor material prior to forming an ohmic contact. Once the ohmic contact metal is deposited and annealed, the highly doped material layer is etched away to expose the areas for formation of a gate and a drift region, for example. However, during the etching process the exposed material surface can suffer a number of detrimental effects that result in defects in the material. The defects produced by the etching process also produce a doping effect, in addition to detrimental effects on the interface density of states under the gate, for example.

Accordingly, it would be desirable to reduce or eliminate the nitrogen outdiffusion of the semiconductor material surface layer during high temperature annealing steps, to reduce or eliminate the high residual doping effect in semiconductor surface layers during formation of ohmic contacts.

It would also be desirable to obtain a device passivation that protects the surface of the semiconductor device to prevent surface breakdown. It would also be desirable to prevent field crowding effects that can typically result from the conventional processing techniques discussed above.

SUMMARY OF THE INVENTION

In accordance with an exemplary embodiment of the present invention, the formation of an ohmic contact on a semiconductor device in the III-nitride material system is provided using a non-stoichiometric, highly doped GaN layer deposited before the ohmic contact is deposited. The highly doped GaN layer is very thin and forms a very low resistive contact with the ohmic material used for the ohmic contact due to a tunneling effect at the interface between the highly doped GaN layer and the ohmic contact material. The presence of the highly doped GaN layer permits the ohmic contact to be formed with little or no damage to the semiconductor device surface. The highly doped GaN layer and ohmic contact are activated with a low temperature annealing step, to maintain a low resistance path for the device through the ohmic contact. The highly doped GaN layer permits the formation of high quality ohmic contacts with a low temperature annealing step to avoid the nitrogen outdiffusion from the semiconductor material surface. The thin highly doped GaN layer also permits the formation of a gate electrode without surface repassivation. Accordingly, the resulting device has a high quality interface with low interface density of states and low residual doping under the gate electrode.

In accordance with another aspect of the present invention, a thin layer of highly doped poly GaN may be formed over the semiconductor material prior to the formation of an ohmic contact. A number of other materials may also be used for the thin layer formed prior to the formation of the ohmic contact and to passivate the semiconductor material, including other III-nitride materials such as AlGaN. The thin passivation layer can be formed using any established technique, such as, for example, PECVD, sputter deposition and so forth. If aluminum is used as the ohmic contact material, a good contact can be achieved with an annealing step using a temperature under approximately 850° C.

According to another feature of the present invention, a non-volatile, non-diffusive material such as AlN, HfN or other appropriate material is deposited over the exposed surface of the semiconductor material prior to the formation of an ohmic contact. The overlaid material prevents surface damage caused during the ohmic contact formation due to high temperatures, exposure to chemical processes, or other treatments associated with the formation of the low resistance ohmic contact. The protective layer may be removed in particular regions to permit formation of schottky contacts. The remaining protective material is maintained to passivate the surface of the semiconductor material in the regions between the contact areas.

The protective layer may be formed as a sacrificial layer of nitrogen containing material that is placed over the high field region of the device prior to the formation of the ohmic contact. The passivation material acts as a reservoir of nitrogen to maintain the stoichiometry within the III-nitride material. The passivation material balances the nitrogen outdiffusion from the III-nitride material with an equal amount of measured indiffusion into the III-nitride material from the capping sacrificial layer. After the formation of the ohmic contact in the annealing step, the protective layer can be removed in the region where a schottky contact or gate contact is to be formed. The remaining material passivates the surface areas in the regions between the contact areas.

The present invention permits the construction of III-nitride semiconductor devices with a simple passivation layer that allows the formation of an ohmic contact with a low temperature annealing step. The passivation layer also suppresses surface breakdown and field crowding effects in the completed device. The device made in accordance with the present invention can withstand very large voltages in reverse bias because the dielectric integrity of the III-nitride materials is preserved. The resulting device has improved voltage blocking properties over known devices that are several times greater than the properties of conventional devices.

Advantageously, cladding and contact layers may be grown above or below the active region. Other known processes for constructing electrodes, insulation layers and so forth may also be applied to the present invention.

In accordance with the present invention, there is provided a device realized in a III-nitride material system that is capable of high current conduction and high voltage blocking with a reduced ON resistance. The device operates to manipulate the 2DEG between two III-nitride materials, using ohmic contacts and schottky or insulated contacts.

In accordance with the present invention, there is provided a FET device, realized in a III-nitride material system. The FET is capable of carrying high currents due to the nature of the III nitride material system, where piezoelectric and spontaneous polarization fields contribute to forming a 2DEG that permits high carrier mobility and large current throughput.

According to a feature of the present invention, a good GaN insulator interface is provided to improve current carrying capacity, rather than additional insulator layers or structures at the active layer. Without added insulation layers, the epitaxial nature of the hetero-interface described here leads to an order of magnitude higher mobility for the electrons in the 2DEG when accumulated.

In accordance with one embodiment of the present invention, a III-nitride device is provided with a reduced turn on voltage for forward conduction. The device is formed with two III-nitride material layers in which one of the III-nitride material layers has a larger in-plane lattice constant than the other, resulting in the formation of a 2DEG at the interface. The high carrier mobility in the 2DEG permits a low forward conduction voltage to turn on the device. Current through devices shunted through the 2DEG channel and out of an ohmic contact to avoid the schottky barrier. Under reverse voltage conditions, a schottky contact interrupts the 2DEG and opens the channel to prevent current flow in the reverse bias condition.

According to a feature of the present invention, the schottky contact is formed in a recess of a III-nitride layer, such that the device is non-conducting until a forward voltage is applied. Advantageously, the recess has sloped walls to permit easy controllability of device parameters.

According to another exemplary embodiment of the present invention, there is provided a schottky type rectifier in a III-nitride material system, where the device conducts current through a channel that includes a 2DEG formed by the interface of two different layers of III-nitride materials. The device includes a schottky contact and an ohmic contact for conduction in one direction toward the ohmic contact, and a blocking voltage in the other direction toward the schottky contact. The voltage applied to the schottky contact permits current to flow through the channel formed by the 2DEG and out of the ohmic contact, while a voltage applied in an opposite direction depletes the 2DEG under the schottky contact to block voltage during reverse bias. When GaN is used as one of the III-nitride layers, the highly resistive nature of the GaN layer prevents leakage currents through the device. The device may be constructed with little or no doping of the III-nitride layers to obtain a low field during reverse bias that permits high standoff voltages. This attractive feature is obtained without sacrificing an increase in forward bias resistance.

The large dielectric breakdown field in the III-nitride semiconductor material system permits the construction of power devices with reduced size standoff regions. The material system also permits the production of devices with reduced specific on resistance in comparison with known devices of similar voltage ratings. In the case of the III-nitride devices discussed herein, a planar device has approximately a one hundred fold improvement in specific on resistance at a voltage rating of approximately 300 volts when compared to a vertical geometry counterpart.

The device is also characterized by low leakage in the contacts and a high breakdown field from the barrier layer. As a result, the device provides a larger dielectric constant compared to conventional insulators such as $SiO_2$ and SiN. The high critical fields of the GaN material allow thin layers to withstand large voltages without dielectric breakdown. The dielectric constant of GaN materials is approximately 10, which is a factor of 2.5 times better than $SiO_2$.

Other features and advantages of the present invention will become apparent from the following description of the invention which refers to the accompanying drawings.

BRIEF DESCRIPTION OF THE DRAWINGS

FIGS. 1A-1E are a cross-sectional views of a III-nitride device with a passivation layer formed in accordance with the present invention.

FIGS. 2A-E are cross-sectional views of a III-nitride device with a passivation layer formed in accordance with the present invention.

DETAILED DESCRIPTION OF THE PREFERRED EMBODIMENTS

Figure 3:
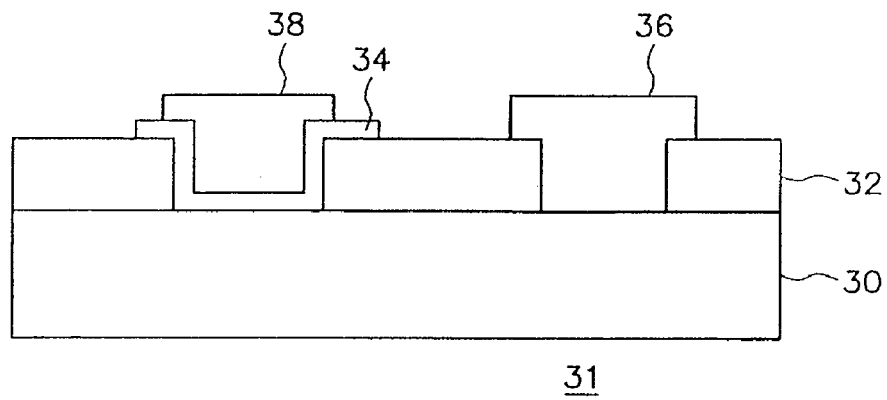
FIG. 3 is a cross-sectional view of a III-nitride device according to the present invention.

In the construction of GaN material devices, a number of factors come into play to impact the functionality and capability of the devices. A large lattice mismatch in III-nitride materials and the strong piezoelectric and polarization effects in these materials significantly impact the electrical properties of III-nitride heterojunction devices. A significant number of reported GaN-based devices to date use strained GaN-AlGaN junctions with alloy compositions that are designed to relieve the strain to avoid dislocations that may be responsible for long term instabilities in the devices. Various devices and systems for building heterojunction devices have been proposed to control the lattice mismatch and the strain of the GaN-AlGaN junctions. These devices are particularly designed to take advantage of piezoelectric and spontaneous polarization effects and to minimize long term instabilities.

III-nitride devices, and GaN/AlGaN devices in particular, typically have one or more terminals for controlling electrical power flow in a given device. An electrical potential applied to a terminal controls the flow of current in an electrically conductive channel to which the terminal is coupled. The electrically conductive channel is defined by at least one heterointerface between two different semiconductor materials.

When AlGaN/GaN materials compose the semiconductor materials of a heterojunction device, and AlGaN is used as a barrier layer, polarization charges resulting from the spontaneous polarization properties of AlGaN as well as strain induced characteristics known as piezoelectric polarization fields are present. The control of the formation of these fields in the construction of a III-nitride device leads to different characteristics that make GaN-based devices suitable for a wide variety of applications depending upon how the device is characterized.

Heterojunction devices formed with GaN materials typically include a barrier layer of AlGaN that is disposed on the channel layer to induce a 2DEG that produces a high concentration of electrons in the channel to thereby enhance the electrically conductive properties of the channel. Due to the presence of the 2DEG formed at the interface of the AlGaN/GaN layers, fundamentally formed III-nitride devices are nominally on because the presence of the channel permits conduction of current between electrodes, for example.

Referring now to FIGS. 1A-1E, a series of steps in a process for forming a III-nitride device 14 with an ohmic contact and a gate electrode is illustrated. Device 14 includes a III-nitride layer 10, that may be composed of multiple layers of III-nitride material, such as a buffer layer, superlattice layers of alternating composition or a graded composition layer. Typically, layer 10 is composed of GaN.

A gate insulator layer 12 is formed over layer 10, and is composed of a material that has a smaller lattice constant than layer 10. Typically, layer 12 is formed of AlGaN. Layer 12 typically operates to passivate the III-nitride device, but suffers from nitrogen outdiffusion during high temperature processing with the formation of an ohmic contact.

Referring now to FIG. 1B, an ohmic contact window 11 is opened in layer 12 to provide access to layer 10 for the deposition of an ohmic contact. The patterning and removal of select portions of layer 12 may be achieved through known techniques.

Referring now to FIG. 1C, prior to the deposition of the ohmic contact material, a non-volatile, non-diffusive material 16 is formed over device 14. Material 16 overlays layer 12 in regions outside of the ohmic contact window 11, and overlays layer 10 at the bottom of ohmic contact window 11. Material 16 can be AlN, HfN, AlGaN, highly doped GaN, highly doped poly GaN, LPCVD SiN or other appropriate material that protects the semiconductor surface 12 from outdiffusing and damage during an anneal step. A layer of high doped poly GaN provided as layer 16 may be from about 300 to about 400 Å thick. In any case, the thickness of material 16 may be approximately 50 Å or greater.

Material 16 may be formed during a growth process during which layers 10 or 12 are formed. Material 16 may also be deposited as a separate step, given a preformed structure including layers 10 or 12. Material 16 formed during an epitaxial growth process provides advantages in performance for the later formed device, including contributing to improving the device breakdown voltage due to the structure of the grown material 16.

Once layer 16 has been deposited over layer 12 and layer 10 within ohmic contact window 11, material for an ohmic contact 19 is deposited over layer 16. Material 18 deposited over layer 16 and in ohmic contact window 11 to may be an ohmic metal and can be composed of aluminum, for example. The deposition of material 18 may be provided according to a known technique for forming ohmic contact material. Protection layer 16 provides a conduction path for ohmic contact 19 to connect with layer 10, and in particular provides a conduction path to the interface between layer 10 and layer 12 to permit a connection to the conduction channel at the interface. Accordingly, the conduction resistance of device 14 is not significantly increased with the introduction of layer 16.

During the deposition of ohmic material 18, an anneal step is performed to process the ohmic material to form ohmic contact 19. In the anneal step, nitrogen ordinarily diffuses out of layers 10 and 12, resulting in damage to the surfaces of layers 10 and 12 and a dopant effect in the material of those layers. However, the presence of protective layers 16, which is nitrogen rich, counters the outdiffusion process that would normally take place during the anneal step. Accordingly, the surfaces of layers 10 and 12 are prevented from damage that would otherwise occur in the outdiffusion process of the anneal step. By providing protection to prevent the outdiffusion of nitrogen from layers 10 and 12, the device characteristics are greatly improved, resulting in a higher breakdown voltage.

Referring now to FIG. 1D, resist material 13 is deposited in a pattern to permit the formation of a gate 15 and ohmic contact 17. After the deposition of photoresist layer 13, material 18 is removed, as by etching, except where protected by photoresist 13. The removal, or etching process, also eliminates protective layer 16 under patterned photoresist 13.

Referring to FIG. 1E, the resulting gate contact 15 and ohmic contact 17 are connected to particular areas of device 14 through the remaining portions of protective layer 16. The remaining portions of protective layer 16 form a low resistance connection between ohmic contact 17 and the conduction channel in layer 10. Note that gate contact 15 is also atop protective layer 16. However, gate contact 15 may be formed according to other techniques and does not rely upon protective layer 16.

After material 18 has been removed from device 14 in regions not covered by photoresist 13, photoresist 13 is stripped off and the resultant structure is subjected to a low temperature anneal step. The temperatures in the anneal step are below about 850° C., and preferably about 600° C. The low temperature anneal step activates ohmic contact 17 to provide a low resistance connection point between the conduction channel formed in layer 10 and contact 17. A low temperature anneal step produces little or no outdiffusion of nitrogen from layers 10 and 12, and therefore avoids the damage ordinarily encountered in a high temperature anneal step.

Referring now to FIGS. 2A-2E, another embodiment of the device according to the present invention is illustrated as device 24. Construction of device 24 begins in FIG. 2A with a III-nitride layer 20, that may be formed as a multiplayer III-nitride structure, including a buffer layer, a superlattice structure or compositionally graded layer, for example. Protection layer 22 is deposited over layer 20 in the initial step illustrated in FIG. 2A. Protection layer 22 may be formed according to any known technique, including PECVD, LPCVD and sputtering. Protection layer 22 may be composed of a number of materials, including AiN, HfN, highly doped GaN, highly doped poly GaN, LPCVD SiN or other III-nitride materials including AlGaN. Layer 22 is relatively thin to permit the formation of a low resistance contact with ohmic materials due to the tunneling effect at the interface between protective layer 22 and overlaid ohmic material. The protective layer may be on the order of 300-400 Å thick, or approximately 50 Å or greater to permit a low resistive contact to be formed to take advantage of the tunneling effect at the interface.

Protective layer 22 may be formed during a growth process during which layer 20 is formed. Protective layer 22 may also be deposited as a separate step, given a preformed structure including layer 20. If protective layer 22 is formed during an epitaxial growth process, certain advantages in performance for the later formed device are obtained, including contributing to improving the device breakdown voltage due to the structure of protective layer 22.

Referring now to FIG. 2B, an ohmic contact window 21 is opened in protective layer 22 to permit the formation of an ohmic contact. Any type of known patterning and material removal technique may be used to open ohmic contact window 21. Ohmic contact window 21 permits access to III-nitride layer 20, as well as access to the conductive channel in III-nitride layer 20.

Referring now to FIG. 2C, an ohmic contact 26 is deposited over protective layer 22 and III-nitride layer 20 such that contact is made with III-nitride layer 20 through ohmic contact window 21. The formation process of ohmic contact 26 includes a high temperature step that ordinarily causes nitrogen outdiffusion in III-nitride layer 20, leading to damage or defects in the surface region of III-nitride layer 20. However, the presence of protective layer 22 reduces or eliminates the nitrogen outdiffusion from III-nitride layer 20, to reduce or eliminate the damage otherwise typically observed in the surface region of layer 20.

Referring now to FIG. 2D, after formation of ohmic contact 26, a schottky contact window 25 is opened to expose III-nitride layer 20 to protective layer 22. In FIG. 2E, a schottky contact 28 is deposited through schottky contact window 25, and provides a connection to the conduction channel formed by III-nitride layer 20. Protective layer 22 again prevents the outdiffusion from III-nitride layer 20 to enhance the properties of device 24. For example, a drift region 27 is protected from surface breakdown or a dopant effect that would ordinarily occur with outdiffusion of nitrogen from III-nitride layer 20. In addition, region 29 is protected from field crowding that would otherwise result from the dopant effect of the outdiffusion of nitrogen from III-nitride layer 20. Typically, an anneal step is performed to activate ohmic contact 26, and the presence of protective layer 22 permits the anneal to take place at a lower temperature, such as 850° C., or preferably 600° C., for example.

The passivation/protection layer described above may be deposited according to the stoichometric or non-stoichometric methods, including PECVD and sputtering deposition. The protective layer is preferably composed of thin N+GaN, although a number of other materials may be used as well. The voltage blocking characteristics of the resulting device are several times greater than the characteristics of devices that fail to include a protective layer, including known schottky rectifiers or gallium nitride devices without the surface protection layer. The passivation/protection layer can act to prevent the outdiffusion of nitrogen from an underlying layer, either by reducing the outdiffusion or eliminating it altogether, or by resupplying outdiffused nitrogen. The passivation/protection layer may act as a nitrogen rich well to balance the outdiffusion by providing its own nitrogen outdiffusion. Accordingly, the passivation/protective layer can be thought of as an encapsulant for surface protection and passivation of the resulting device. The passivation layer need not be removed from the completed device so that the entire exposed surface of the resultant device is passivated.

A number of devices may be formed given the technique of the present invention, including schottky diodes, FETs, current limiting devices such as pinch resistors and so forth. Typically, any type of semiconductor device that would suffer from nitrogen outdiffusion during processing, with the resultant decrease in dielectric breakdown thresholds would benefit from the technique of the present invention. Preferably, the present invention is used in the III-nitride material system, including compounds of AlN, GaN, InN and alloys of these materials. These protective layers may be formed of any type of non-volatile, non-diffusive material such as AlN, HfN or other suitable material deposited over the exposed surface to protect the semiconductor surface from nitrogen outdiffusion during annealing or other high temperature processing.

Layer 10 of device 14 has a larger in-plane lattice constant than layer 12. It should be apparent that an number of III-nitride materials may be used to form device 14, as long as an interface permits a channel to be formed for current conduction. Device 14 may be provided on an insulating or highly resistive substrate, which is typically formed from well-known materials, such as silicon carbide, silicon, saphire and other well-known substrate materials.

Devices 14, 24 may be constructed with a number of different geometries for ohmic contacts 17 and 26 and schottky contact 28. For example, contact 28 can be a schottky contact encircling ohmic contact 26. Contact 28 may also be formed around a portion of ohmic contact 26, with gaps or etched regions formed to limit current flow in specific directions or to specified regions on device 24. Ohmic contact 26 and contact 28 formed as a schottky contact can also be spaced various distances from each other to increase or decrease breakdown voltage and on-resistance parameters.

Referring now to FIG. 3, an alternate embodiment of the present invention is illustrated as a device 31. Device 31 is substantially similar to device 24 (FIGS. 2A-2E), with the exception that contact 38 is formed of a conductive material on an insulator layer 34. Accordingly, contact 38 is an insulated contact rather than a schottky contact, and can include a metal conductor of any type to operate device 31. Protective layer 32 provides the same suppressing feature of nitrogen outdiffusion from III-nitride layer 30 as with device 24.

Ohmic contacts 14, 26 and 36 may be fabricated in a number of ways, such as implantation prior to deposition, deposition of highly doped III-nitride material on top of layers 10, 12 or 20, 22 or 30, 32 prior to ohmic deposition, III-nitride super lattice structure formation under ohmic contacts 19, 26 and 36, etching of layers 12, 22 or 32, in combination with the above depositions, and so forth.

The present invention is applicable to devices that are bi-directional, which improves their flexibility and the number of applications for which they are suitable. The invention is also applicable to HFETs where the gate electrode is shorted to the source/drain electrode. The separations between the ohmic and schottky contacts can be varied to modify device parameters, such as on resistance and breakdown voltage. The geometry of the contacts can be realized in a variety of configurations, such as schottky material encircling an ohmic contact, two schottky contacts encircling each ohmic contact, a non-encircling schottky with etched regions to limit current flow to specified regions on the device, and so forth.

Figure 4:
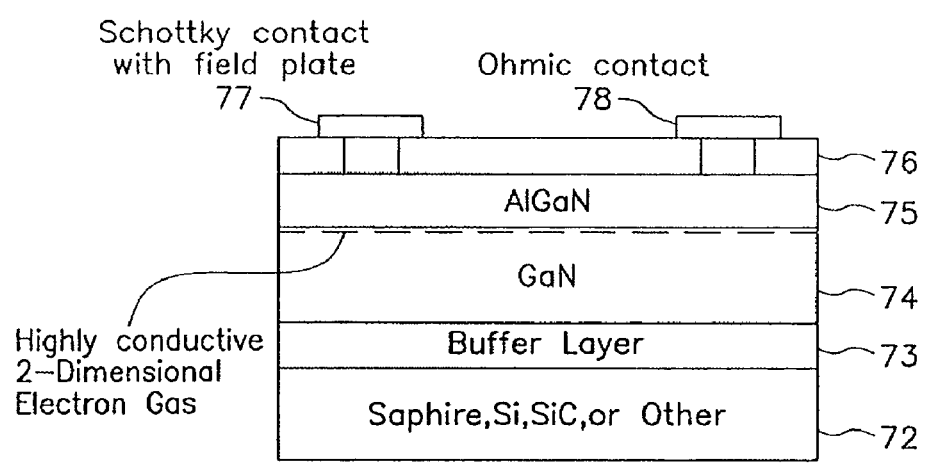
FIG. 4 is a cross-sectional view of a III-nitride device according to the present invention.

Referring now to FIG. 4, another embodiment of the present invention is illustrated as device 70. Device 70 includes a substrate 72 composed of insulative or highly resistive material, such as sapphire, silicon, silicon carbide or other suitable materials. A resistive III-nitride material layer 74 overlays substrate 72, and optionally includes a buffer layer 73 interposed between layer 74 and layer 72. Buffer layer 73 can be interposed between layers 74 and 72 to reduce or alleviate the strain forces related to the lattice mismatch between layers 72 and 74. Another III-nitride material layer 75 is overlaid on layer 74 such that layer 75 has a smaller in plane lattice constant than layer 74. In accordance with the nature of III-nitride materials, a 2DEG forms between layers 74 and 75 that is capable of carrying high amounts of current. As illustrated in FIG. 4, layers 74, 75 may be composed of GaN/AlGaN.

Device 70 also includes a protective layer 76 that protects the underlying layer as well providing a means for patterning the device to form contacts and electrodes.

Device 70 also includes contacts 77 and 78, where contact 77 is a schottky contact and contact 78 is an ohmic contact. Contacts 77, 78 are arranged in a field plate design where the portion of the contacts extending through insulating layer 76 to contact layer 75. Protective layer 76 prevents outdiffusion of nitrogen during high temperature processing steps in the formation of device 70.

The resulting device is a nominally on rectifier due to the formation of the high density high mobility 2DEG at the interface between layers 74, 75. The 2DEG is formed through a combination of piezoelectric and spontaneous polarization forces, resulting in an extremely thin yet highly conductive layer and a highly resistive layer. A channel formed at the interface between layers 74 and 75 can carry very high current without the use of a thick doped region as was done in conventional device. Accordingly, in a forward biased direction where the device is conducting, high amounts of current may be carried through the channel.

Under reverse bias conditions, the channel is depleted of mobile charge, so that no current flows in the channel, and the highly resistive nature of the underlying layer 74 prevents charge from flowing in that layer as well. The use of protective layer 76 in the formation of device 70 improves the reverse bias operation of the device by avoiding damage to the surfaces of the III-nitride material during processing. Because layers 74 and 75 are undoped, the reverse bias condition of the device produces low electric fields. Because the fields are of a low value, the device is capable of withstanding high voltages, but still produces a low forward bias resistance. By providing the highly conductive 2DEG rather than a doped current carrier, device 70 greater improves RA product for a given breakdown voltage. Another feature of device 70 is the ability to isolate the device by etching layer 75, due to the resistive qualities of layer 74. All these features and advantages permit the integration of a number of devices on a single chip with a small cost in real estate so that high power device exhibiting some amount of complexity can be formed in a smaller space than was conventionally possible.

The construction of ohmic contacts, schottky contacts, insulator layers and metallized contacts may be performed according to known techniques. In addition, further passivation layers and cladding may be applied to the devices described herein, as well as techniques for forming contacts to current carrying electrodes and gates to provide a finished device.

The III-nitride materials used to construct devices 14, 24, 31 and 70 typically exhibit much better blocking characteristics than conventional materials, so that the devices may be constructed in a smaller size than is permitted with conventional materials, while maintaining operational parametric values. Because the devices may be realized in a smaller size than conventional devices to perform comparative functions, a reduced on-resistance can be realized to obtain improved power efficiency. The improved breakdown voltage characteristics provided by the present invention permits further size reductions with greater power efficiency.

In addition, the electrodes described herein may be formed with a low resistive ohmic contact process that further improves the operational characteristics of the described devices.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A III-nitride semiconductor device, comprising:
   a conduction channel formed at an interface between two III-nitride layers having different lattice constants;
   a gate contact;
   an electrode coupled to the channel to carry channel current;
   a protective layer under the electrode; and
   another protective layer under the gate contact, the another protective layer comprising highly doped GaN.

2. The device according to claim 1, wherein the III-nitride layers are composed of GaN and AlGaN, respectively.

3. The device according to claim 1, wherein the electrode is an ohmic contact.

4. The III-nitride semiconductor device of claim 1, wherein said protective layer comprises highly doped GaN.

5. The III-nitride semiconductor device of claim 1, wherein said III-nitride semiconductor device comprises a high electron mobility transistor (HEMT).

6. A III-nitride semiconductor device, comprising:
   a heterojunction including a first III-nitride semiconductor layer and a second III-nitride semiconductor layer formed over said first III-nitride semi conductor layer;
   an opening extending through said second III-nitride semiconductor layer to said first III-nitride semiconductor layer;
   a protective layer formed in said opening, said protective layer formed on said first III-nitride semi conductor layer;
   an electrode formed on said protective layer, said electrode coupled to a conductive channel of said first semiconductor layer through said protective layer.

7. The III-nitride semiconductor device of claim 6, wherein said first III-nitride semiconductor layer comprises gallium nitride (GaN).

8. The III-nitride semiconductor device of claim 6, wherein said second III-nitride semiconductor layer comprises aluminum gallium nitride (AlGaN).

9. The III-nitride semiconductor device of claim 6, wherein said protective layer comprises highly doped GaN.

10. The III-nitride semiconductor device of claim 6, wherein said electrode makes ohmic contact with said first III-nitride semiconductor layer through said protective layer.

11. The III-nitride semiconductor device of claim 6, further comprising a gate formed over said second III-nitride semiconductor layer.

12. The III-nitride semiconductor device of claim 11, further comprising another protective layer formed between said gate and said second III-nitride semiconductor layer.

13. The III-nitride semiconductor device of claim 12, wherein said another protective layer comprises highly doped GaN.

14. The III-nitride semiconductor device of claim 6, wherein said III-nitride semiconductor device comprises a high electron mobility transistor (HEMT).

* * * * *

UNITED STATES PATENT AND TRADEMARK OFFICE
CERTIFICATE OF CORRECTION

PATENT NO.        : 7,649,215 B2
APPLICATION NO.   : 11/004212
DATED             : January 19, 2010
INVENTOR(S)       : Robert Beach It is certified that error appears in the above-identified patent and that said Letters Patent is hereby corrected as shown below:

In the claims, column 12, line 26, "semi conductor" should be changed to --semiconductor--.

In the claims, column 12, line 31, "semi conductor" should be changed to --semiconductor--.

Signed and Sealed this
Twenty-second Day of November, 2011

David J. Kappos
*Director of the United States Patent and Trademark Office*